United States Patent [19]

Greene et al.

[11] Patent Number: 4,573,152

[45] Date of Patent: Feb. 25, 1986

[54] SWITCH MATRIX TEST AND CONTROL SYSTEM

[76] Inventors: Richard E. Greene, Sasqua Rd., Norwalk, Conn. 06855; Gladstone F. Young, 5 Winding Brook Ct., Redding, Conn. 06875; Gary E. Tom, 12 Aunt Patty's La., Bethel, Conn. 06801; Harry G. Schaffer, 5 Spicer Ct., Westport, all of 06880; John S. Foote, RR #198, South Salem, N.Y. 10590

[21] Appl. No.: 494,323

[22] Filed: May 13, 1983

[51] Int. Cl.⁴ ............... G06F 11/00; G01R 31/28
[52] U.S. Cl. ............... 371/22; 364/200; 371/24
[58] Field of Search ............ 371/5, 15, 16, 25, 22, 371/24; 364/200, 900

[56] References Cited

U.S. PATENT DOCUMENTS

| | | | |
|---|---|---|---|
| Re. 30,037 | 6/1979 | Bass | 371/22 |
| 3,588,837 | 6/1971 | Rash et al. | 364/200 |
| 3,704,363 | 11/1972 | Salmassey et al. | 371/5 |
| 3,905,023 | 9/1975 | Perpiglia | 364/200 |
| 4,048,672 | 9/1977 | Seiden et al. | 364/200 |
| 4,057,847 | 11/1977 | Lowell et al. | 364/200 |
| 4,207,609 | 6/1980 | Luiz et al. | 364/200 |
| 4,351,059 | 9/1982 | Gregoire et al. | 371/22 X |
| 4,367,525 | 1/1983 | Brown et al. | 364/200 |
| 4,403,286 | 9/1983 | Fry et al. | 364/200 |

*Primary Examiner*—Charles E. Atkinson
*Attorney, Agent, or Firm*—St. Onge, Steward, Johnston & Reens

[57] ABSTRACT

A switch matrix system is described with which peripheral devices can be conveniently tested for compatibility with central processor units. A diagnostic channel is provided to which a peripheral device to be tested is connected at a crosspoint in the switch matrix system. A control provides a sequence of signals needed to establish data communication between the central processor unit and the peripheral device. Errors or failures in the sequence are detected and stored and displayed with a terminal from which the switch matrix system is operated. Additional testing is done by generating bit test patterns and comparing the returns with those sent out. A channel activity monitor is employed in the switch matrix system to enable a comparative review of activity of channels from different central processor units.

11 Claims, 5 Drawing Figures

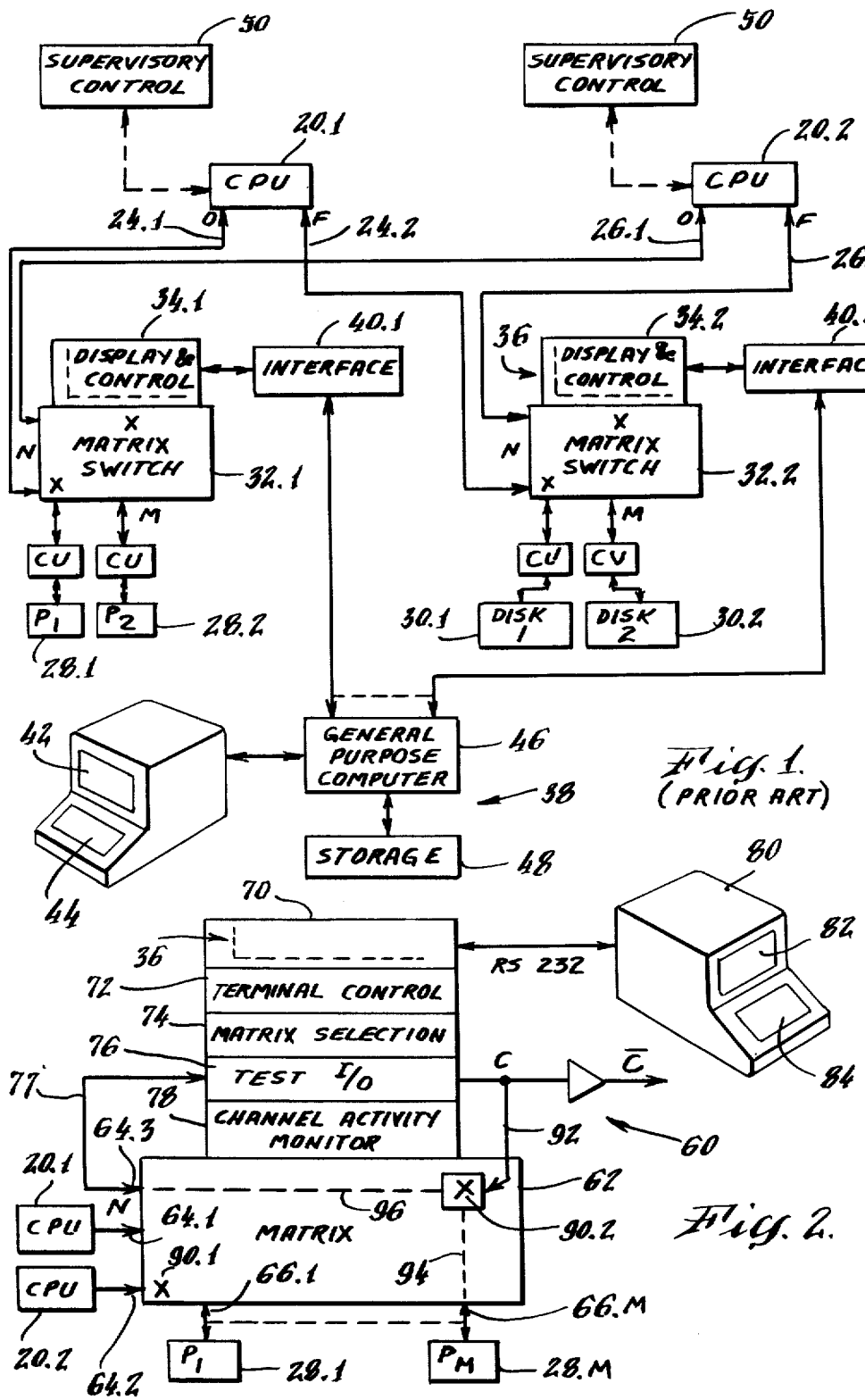

Fig. 4.
Fig. 5.
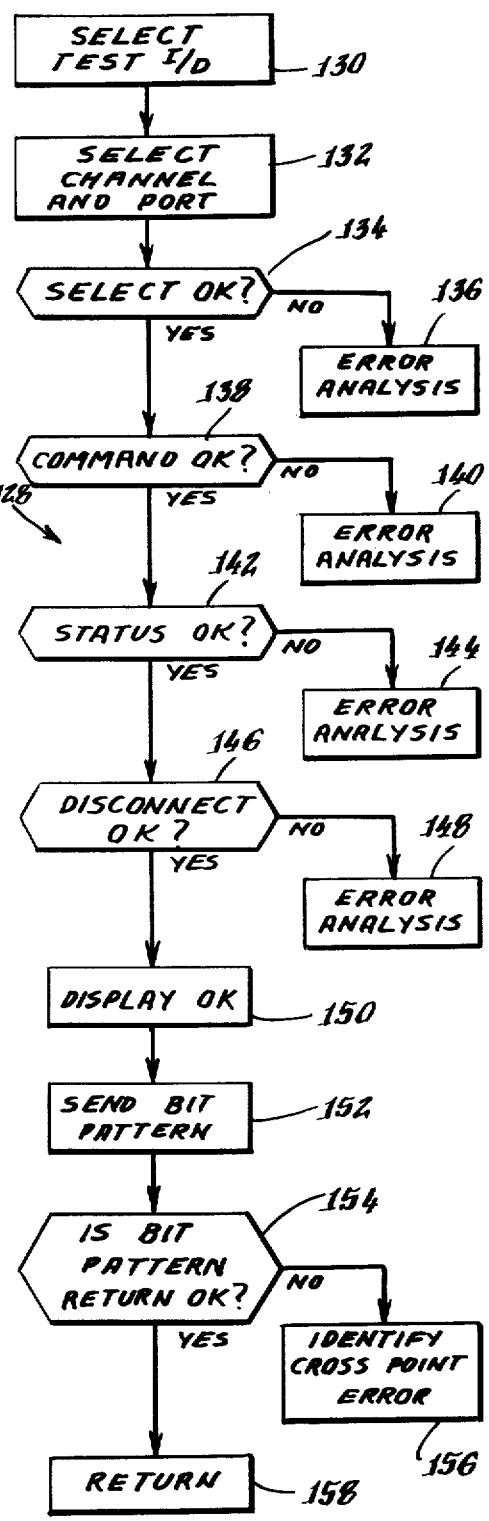
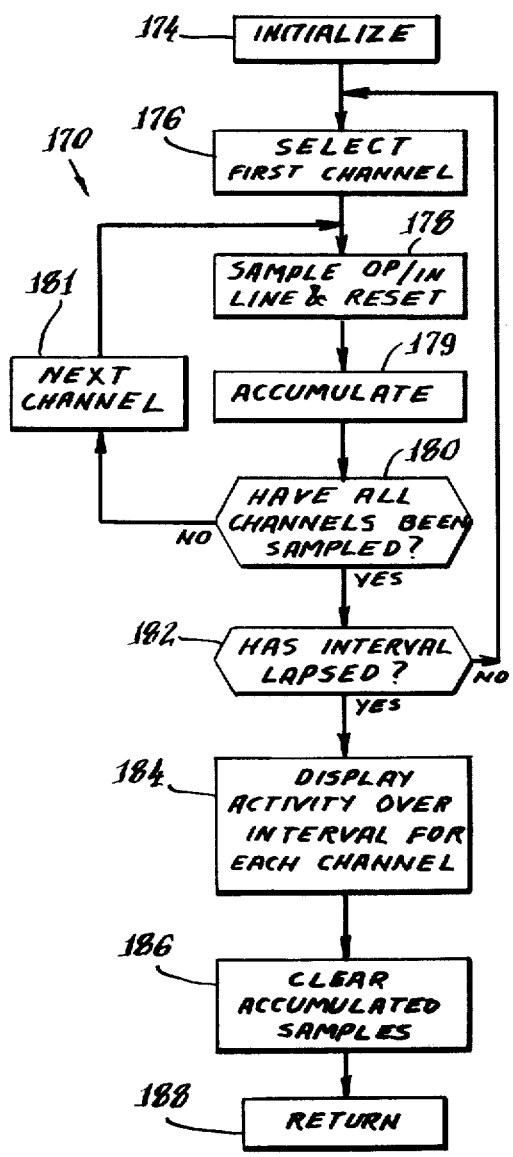

SWITCH MATRIX TEST AND CONTROL SYSTEM

FIELD OF THE INVENTION

This invention generally relates to a method and system for controlling the connection of central processor units to peripheral devices. More specifically, this invention relates to a method and system for testing the compatability of a peripheral device for connection to a central processor unit.

BACKGROUND OF THE INVENTION

In the field of large computer installations, one or several central processor units (known as CPUs) are often connectable to peripheral devices through a switch matrix. Channels of the CPUs are connected to channel ports of the switch matrix and peripheral devices such as card readers, printers, tape and disk drives are connected to peripheral ports of the switch matrix. Crosspoints in the matrix are then controlled so that a CPU can be connected to one or more peripheral ports and peripheral devices.

Control over the matrix establishes a configuration that is hopefully an efficient one in which the CPUs are kept about equally busy. The switch matrix enables one to alter the configuration in a rapid manner so as to minimize down time in case of an equipment failure. For example, if a critically important CPU fails, this can be quickly disconnected and another one inserted. The complexity of such a switch matrix can be appreciated when one considers that each CPU may have a large number of input/output channels, such as 16, with each channel often formed of over sixty coaxial conductors, and with a channel connected to many peripheral devices, frequently as many as twenty four. Matrix switches may be as large as 16×24, i.e. 16 CPU channels on the channel side and 24 peripheral devices on the port side. Further complexities arise by virtue of high data speeds employed between the CPU and a peripheral device making it desirable to take steps to avoid problems such as crosstalk, signal interference and poor conductor connections. It would be fair to state that once a large computer installation is connected and functioning properly, it is undesirable to physically remove a CPU or a peripheral device or even change connecting cables lest the physical disruption causes a malfunction that can disturb the entire system. System failures can be extremely costly, as much as thousands of dollars per minute.

Yet equipment malfunctions do occur and to a large extent the switch matrix interposed between the CPU and peripheral devices can be extremely effective in eliminating or bypassing such malfunctions. For example, in one exemplary prior art system as shown in FIG. 1, a multiple of CPUs 20.1, 20.2 are shown with their channels 24.1, 24.2 and 26.1, 26.2 connected to peripheral devices 28.1, 28.2 and 30.1, 30.2 through switch matrixes 32.1, 32.2. Each switch matrix has a display and control 34 with which a desired matrix configuration can be established and then so displayed.

Control over the matrix can be obtained with local switches at 36 or by way of a remote control system 38 connected to effect matrix configurations through interface units 40.1 and 40.2. The remote control employs a CRT 42 with a keyboard 44 and general purpose computer 46 is provided with suitable programs and a storage 48. These programs may provide alternate configurations that can be instantly applied to a switch matrix 32 so as to bypass a malfunctioning device or system. A large number of switch matrices 32 can be controlled with control 38 from a central console.

When a new peripheral device is to be connected to a CPU 20 care must still be taken to properly check out the compatability of the device with the CPU. In the parlance of the computer expert, this means testing the I/O (input and output) compatability of the CPU channel with the peripheral device. When the CPU is part of an IBM computer, the I/O between a channel and a peripheral device is a very complex series of signals and protocols. Such signals and protocols are described in the art and are generally known as evidenced by the large number of so-called IBM plug-compatible peripheral devices available from others than IBM. The I/O compatibility of pheripheral devices can be determined with a spare CPU, if one is available which is not often the case, or by using a CPU simulator. However, even when compatability is so determined, prudence dictates that a new peripheral device only be allowed to be connected to a system by a highly trained field engineer (the supervisory control suggested at 50) during prescribed system downtimes to assure that the device with its connecting cables will not disturb the installation. The examination of compatibility often then becomes time consuming, partly because the available time for this purpose is limited during any one month and the process itself appears to involve complex software analysis techniques.

In large computer installations where a large number of CPUs are used, it is common practice to provide an analysis of the loading or use made of the channels in a CPU. Thus, techniques exist with which the activities of the channels of any one CPU are compared and bar graphs representative of such use are displayed. Typically, the "Op-In" line of each channel of the CPUs is monitored. Although such activity monitoring indicates the use of the channels in any one CPU, the evenness of the loading between different CPUs is not compared. As a result, a user of such large computer installation prefers to connect his CPUs in a manner whereby some rough distribution of load is made. This is illustrated in FIG. 1 by the connection of all the "O" (24.1 and 26.1) channels of CPUs 20.1 and 20.2 to the same switch matrix 32.1 and similarly, all "F" channels (24.2 and 26.2) to switch matrix 32.2. Similar peripheral devices requiring generally the same amount of access to a CPU are then connected to the same switch matrix 32. Although this helps distribute the loading of the CPUs, the system operator still does not have adequate information on whether the configurations establish even or uneven loading to help in determining whether there is or is not a need to purchase additional equipment. Switch matrices have been provided with channel monitoring lights. However, their flickering does not really provide a reliable indication of channel usage.

SUMMARY OF THE INVENTION

With a switch matrix system in accordance with the invention, a new peripheral device can be tested for compatibility through the switch and when so properly tested, made a part of the computer installation without setting aside of prescribed access time to the system and thus without excessive delays. Supervisory control at the central processor unit can be conveniently reduced and even entirely dispensed with during installation of a peripheral device.

This is obtained by designating in a switch matrix one channel port as a diagnostic channel. A peripheral port can be connected to the diagnostic channel port so that a peripheral device connected to the latter peripheral port can be examined for compatibility.

As described herein for one switch matrix system in accordance with the invention, a sequence signal generator is located in the switch matrix system to produce sequence signals used to establish data communications between a CPU and a peripheral device. The sequence signals are applied to the diagnostic channel so that a peripheral device can be tested prior to connection to a CPU. The switch matrix system is provided with means for analyzing returns on the diagnostic channel port from a peripheral device so that errors can be detected. A display of the nature of a particular error can be conveniently made.

An advantageous aspect of the invention resides in the ability to produce, inside the switch matrix, particular test patterns on the diagnostic channel for testing of the switch matrix itself or the communication circuit employed to connect a peripheral device to a peripheral port. Cross-talk and signal interference problems may in this manner be detected prior to connection of the peripheral device to the active computer installation.

With a switch matrix system in accordance with the invention, an indication of comparative activity of different CPUs can be made. This is obtained by periodically sampling a particular line in each of the channel ports connected to a CPU. The samples are accumulated over desired intervals and the accumulated samples displayed so that an indication of the loading of the various CPUs connected to the switch matrix system can be obtained.

It is, therefore, an object of the invention to provide a switch matrix system with which peripheral devices and their connecting circuits can be tested without requiring special supervisory control at the central processor unit. It is a further object of the invention to provide a convenient method for testing a peripheral device with a switch matrix for compatibility with CPUs connected to the switch. It is a further object of the invention to provide a method for diagnosing and identifying errors in the compatibility of peripheral devices with CPUs connected to a switch matrix.

These and other objects and advantages of the invention can be understood from the following description of a switch matrix system in accordance with the invention and described in conjunction with the drawings.

BRIEF DESCRIPTION OF DRAWINGS

FIG. 1 is a block diagram of an exemplary prior art system using a switch matrix;

FIG. 2 is a block diagram of a switch matrix system in accordance with the invention;

FIG. 4 is a flow chart of the testing operation of the switch matrix system of this invention; and FIG. 5 is a flow chart of an activity determining technique in accordance with the invention.

DETAILED DESCRIPTION OF DRAWINGS

Figure 3:
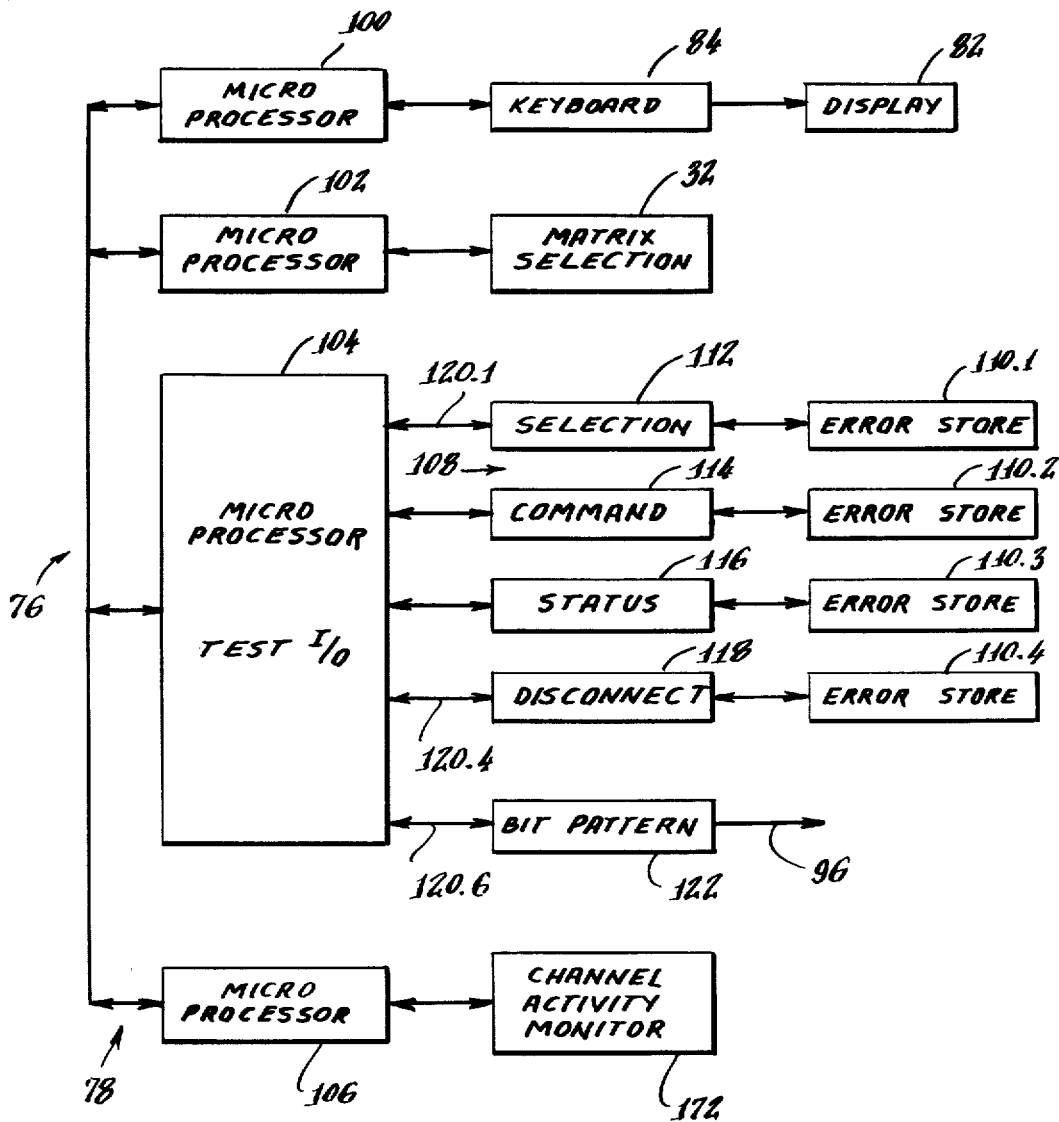
FIG. 3 is a block diagram of components employed in the switch matrix system of FIG. 2.

With reference to FIG. 2 a switch matrix system 60 is shown including a switch matrix 62 which is similar to those NxM switch matrixes used in the embodiment of FIG. 1. Thus, CPUs such as 20.1 and 20.2 have channels 24.1-24.2 connected to channel ports 64.1 and 64.2 respectively. Peripheral devices 28.1-28.M are connected to peripheral ports 66.1-66.M.

Switch Matrix System 60 includes a control 70 with a local control 36 in the form of an array of NxM switches and controls 72, 74, 76 and 78 that are operated from a terminal 80 having a CRT display 82 and keyboard 84. Terminal 80 may be remotely located and connected to control 70 through an RS232 communication link 86. In effect, control 70 incorporates terminal 80, but this is separately shown for clarity.

Communication along link 86 is of a conventional type and similarly, the operation of the display 82 and response to keyboard 84 may utilize a conventional terminal control 72 with devices and techniques that are known in the art.

The terminal 80 operates with the matrix selection control 74 so that when so desired an operator can, by actuation of keyboard 84, cause the connection or disconnection of any one crosspoint 90 in the switch matrix 32. In this manner a channel port 64 can be connected to any one peripheral port 66 for the creation of a CPU peripheral device configuration that is deemed desirable for the particular computer installation. Techniques for generating a switch matrix and causing the closure or opening of a crosspoint 90 are also well known in the art.

In the switch matrix 32 of FIG. 2, a channel port 64.3 is designated as a diagnostic channel. Port 64.3 may be a spare channel port or one that is specifically provided for this purpose. Diagnostic channel port 64.3 is connected to test control 72 which generates to channel port 64.3 a sequence of signals that are needed to address and then establish data communication with a peripheral device such as 28.1 connected to port 66.1 and to channel port 64.1 through crosspoint 90.1.

The test control 76 also operates with terminal control 72 and terminal 80 so that an operator may cause peripheral port 66.M to be connected to channel port 64.3 for testing of peripheral device 28.M. Closure of crosspoint 90.2 may be done, for example, by generating a closure signal c on a line 92 connected to all of the latching elements used to close crosspoint 90.2 while the inverse of the closure signal, c, is used to open all other crosspoints 90 in the row 94 leading to peripheral port 66.M.

Once crosspoint 90.2 is closed, test control 76 is used to seek to establish data communication with peripheral device 28.M using a sequence of signals and protocols that are employed by CPUs 20. For example, if CPUs 20 are IBM computers, a sequence of signals is generated of the type as published in IBM manuals and include a system reset sequence, an address sequence, a command sequence, a status check sequence, and an accept status sequence. In response to these various sequences, a peripheral device must cause certain responses within particular times. If these responses do not occur in a timely fashion or the signal levels are not correct, the peripheral device is deemed unable to pass the input/output control test 76. Hence, by incorporating the test control 76 in switch matrix 32, a peripheral device such as 28.M can be tested for compatibility with CPUs 20 using a diagnostic channel port 64.3 and channel 96.

A particularly effective management control feature is provided by a channel activity monitor 78 in control 70. Activity monitor 78 is coupled to particular lines in each of the channel ports 64 connected to a CPU. Such line may be the "Op-In" line in the case of an IBM CPU.

The channel lines are sampled periodically and the samples accumulated over desired intervals. The number of times that a channel line was active during such interval then becomes an indication of the activity of the channel. This technique is particularly effective when a plurality of channels from different CPUs are connected to the same switch matrix 32 as shown in FIG. 1. An activity measurement that is relevant to different CPUs is then available for at least a partial activity comparison on a single display.

FIG. 3 illustrates one form of a control 70 for use in a switch matrix system of this invention. A plurality of separate but commonly available microprocessors 100, 102, 104 and 106 are provided to individually and respectively operate terminal control 72, matrix selection control 74, test control 76 and channel activity monitor 78.

Test control 76 includes both a hardware segment 108 and software in microprocessor 104. The hardware segment 108 includes logic devices such as timers, flip-flops, gates and the like for implementing particular signal sequences that correspond to the signal sequence needed to establish data communication between a peripheral device and a CPU. In addition, hardware segment 108 incorporates suitable storage devices 110 for storing when and where in the sequence an error or failure occurred. In the embodiment, the signal sequencer devices include a selection sequencer 112, a common sequencer 114, a status sequencer 116 and a disconnect sequencer 118. Appropriate error storage devices 110 are connected to each of these sequencers. The microprocessor 104 initiates each sequencer and interrogates associated error storage devices 110 when a sequencer fails to respond within prescribed intervals.

Microprocessor 104 also includes software to initiate a bit pattern for transmission through appropriate hardware 122 to diagnostic channel port 64.3 and thus to a peripheral device 28. The bit pattern is selected to detect cross-talk and interference problems. A return of the bit pattern can be implemented with suitable turn-around type plugs located at cable ends where the peripheral device 28 is located or through appropriate logic in the peripheral device itself.

FIG. 4 illustrates at 128 steps involved in testing the input/output (I/O) of a peripheral device. At 130 the operator selects the test I/O mode at the keyboard 84 of terminal 80. The selection involves a particular code and use of a password necessary to access microprocessor 104. At 132 the diagnostic channel port (64.3) and appropriate peripheral port 66 are selected to close the proper crosspoint 90.

At 134 the select sequence is commenced by generating an activating signal from microprocessor 104 on line 120.1 to selection network 112 and await a response. If no response occurs within a particular time, an error is assumed and an error analysis is made at 136. This error analysis involves checking into the parts of the selection process such as whether the address return was received, whether Hold-Select-Out and OP-IN lines are in the proper state, and whether the return address compares properly with the one that was sent out. Since these functions are performed in the hardware segment 112, the error analysis involves sampling of error storing devices 110. An appropriate error identifying message is displayed with terminal control 72 and terminal display 82.

Similar steps are executed for the command sequence at 138, the status sequence at 142 and disconnect sequence at 146. Once all sequences have been properly executed, an appropriate display to that effect is made at 150.

A bit pattern is then generated in microprocessor 104 and transmitted at step 152 over lines 77 to the diagnostic channel port 64.3. The return bit pattern is compared at 154 with the pattern that was transmitted. If the comparison yields an error, an identification of the nature and location of the error is made at 156 and displayed. Similarly, if the bit pattern checks out properly, this is so displayed and at 158 a return is made with a display that the peripheral device checked out properly.

FIG. 5 illustrates a technique 170 for monitoring channel activity with microprocessor 106. In this case a certain line, such as the OP-IN line in each of the channel ports 64 is connected to an appropriate storage network 172 (see FIG. 3) which is regularly sampled and then reset by microprocessor 106.

After initializing at 174, the first channel port 64 is selected at 176 and its associated storage network 172 sampled and then reset at 178. The sample is accumulated at 179 in a register or other storage location. A check is made at 180 whether other channel ports 64 need to be checked for activity; if not, the sampling rate can be set as desired with a recurrence of the order of about 80 milliseconds deemed sufficient.

Then at 182 a determination is made whether a particularly desired interval has lapsed. This interval may be of the order of a half a minute or shorter or longer depending upon the nature of the system. The numbers of samples accumulated over the interval for the respective channel ports are then displayed or stored at 184 to form a separate record of the channel activity. The accumulators are then cleared at 186 and the process is caused to be repeated at step 188.

Having thus described the advantages of incorporating peripheral device testing in a switch matrix in accordance with the invention, its advantages can be appreciated. An enhanced management tool is provided with less complexity. The switch matrix system 60 of this invention can be expanded to incorporate a general purpose computer such as 46 to control and manage a plurality of systems 60. Local testing can be performed in the manner described or under control by the general purpose computer if the latter is provided with a control 70. When a large number of switch matrix systems 60 are used, they can be daisy chained so that the terminal of one can execute the control 70 as described. Use of slow speed microprocessors can be made for a less complex and easier to manage switch matrix system 60. Although the invention has been described in particular for use in a computer installation, a similar approach can be applied to communication switch matrices in which case data terminals and communication equipment replace the CPU and peripheral devices and these latter terms are, therefore, defined herein to incorporate such data communication devices.

Variations of the described invention can be made from the illustrative embodiment by one skilled in the art with such variations to be considered a part of the invention as defined by the following claims.

What is claimed is:

1. A switch matrix system for selectively connecting a plurality of central processor units to peripheral devices comprising:

a switch matrix having channel ports and peripheral ports, one of said channel ports being designated as a diagnostic channel port, means for connecting a channel port to one or more peripheral ports, and means for controlling the connection of a channel port to a peripheral port;

means for causing the connection of a peripheral port to said diagnostic channel port; and means for generating a sequence of signals representative of signals employed to establish data communication between a peripheral device and a central processor unit and applying said signals to the diagnostic channel port for transmission to a peripheral port connected to said diagnostic channel.

2. The switch matrix system as claimed in claim 1 and further including:

means for generating a test pattern of signals and applying said test pattern to said diagnostic channel port for transmission to a peripheral port connected by the switch matrix to said diagnostic channel port; and means for receiving said pattern from the latter peripheral port.

3. The switch matrix system as claimed in claim 2 and further including:

means for analyzing the received test pattern for determining the quality of the switch matrix or the quality of a communication circuit employed to connect a peripheral device to a peripheral port.

4. The switch matrix system as claimed in claim 1 and further including:

means coupled to the means for generating a sequence of signals for detecting an error in a particular part of the sequence of signals employed to establish data communications between a peripheral device connected through a peripheral port to the diagnostic channel port and means for storing said error.

5. The switch matrix system as claimed in claim 4 wherein said means for generating said sequence of signals comprises means for generating a sequence of signals that establishes compatability between a peripheral device and an IBM central processor unit.

6. The matrix system as claimed in claim 4 and further including:

means for displaying an identification of a detected error.

7. The switch matrix system as claimed in claim 4 wherein said means for generating said sequence of signals further comprises:

hardware means for producing said sequence of signals and storing a detected error;

a microprocessor coupled to the hardware means, said microprocessor including means for activating said hardware means, and means for monitoring said storing means to identify a detected error.

8. The switch matrix system as claimed in claim 1 and further including:

means for periodically sampling the status of a line of each channel port connected to a central processor unit;

means for respectively accumulating samples of different lines over a desired interval; and means for displaying the accumulated samples to provide an indication of the activity of the central processor units connected to the channel ports of a common switch matrix.

9. A method for testing the compatability of a peripheral device for connection to a central processor unit with a switch matrix having channel ports for connection to central processor units and peripheral ports for connection to peripheral devices comprising the steps of:

connecting a peripheral port to a channel port which is designated as a diagnostic channel port;

generating a sequence of signals representative of the signals employed to establish data communication between a peripheral device and a central processor unit;

applying said sequence of signals to the diagnostic channel port to test a peripheral device connected to the diagnostic channel port; and detecting the compatability or lack thereof in the sequence of signals.

10. The method for testing a peripheral device as claimed in claim 9 and further comprising the step of:

generating said sequence of signals from inside the switch matrix.

11. The method for testing a peripheral device as claimed in claim 9 and further comprising the steps of:

generating a test pattern of signals in the switch matrix;

applying the test pattern to the diagnostic channel port for transmission to a peripheral port;

receiving said pattern of signals from the peripheral port; and comparing the received pattern of signals with the generated test pattern to detect an error therein as a measure of the quality of the switch matrix or the quality of a communication circuit employed to connect a peripheral device to a peripheral port.

* * * * *